United States Patent
Dai et al.

(10) Patent No.: US 10,763,099 B2
(45) Date of Patent: Sep. 1, 2020

(54) WAFER FLATNESS CONTROL USING BACKSIDE COMPENSATION STRUCTURE

(71) Applicant: YANGTZE MEMORY TECHNOLOGIES CO., LTD., Wuhan (CN)

(72) Inventors: Xiaowang Dai, Wuhan (CN); Zhenyu Lu, Wuhan (CN); Qian Tao, Wuhan (CN); Yushi Hu, Wuhan (CN); Ji Xia, Wuhan (CN); Zhaosong Li, Wuhan (CN); Jialan He, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 32 days.

(21) Appl. No.: 16/140,463

(22) Filed: Sep. 24, 2018

(65) Prior Publication Data
US 2020/0058486 A1 Feb. 20, 2020

Related U.S. Application Data

(63) Continuation of application No. PCT/CN2018/100800, filed on Aug. 16, 2018.

(51) Int. Cl.
*H01L 21/02* (2006.01)
*G03F 7/20* (2006.01)
(Continued)

(52) U.S. Cl.
CPC .... *H01L 21/02016* (2013.01); *G03F 7/70691* (2013.01); *H01L 21/02035* (2013.01);
(Continued)

(58) Field of Classification Search
CPC combination set(s) only.
See application file for complete search history.

(56) References Cited

U.S. PATENT DOCUMENTS 6,556,959 B1* 4/2003 Miller ............. G05B 19/41885
257/E21.525
10,403,631 B1* 9/2019 Lu ...................... G11C 8/14
(Continued)

FOREIGN PATENT DOCUMENTS

CN 101442018 A 5/2009
CN 101849284 A 9/2010
(Continued)

OTHER PUBLICATIONS

International Search Report issued in corresponding International Application No. PCT/CN2018/100800, dated May 20, 2019, 4 pages.
(Continued)

*Primary Examiner* — Charles D Garber
*Assistant Examiner* — S M Sohel Imtiaz
(74) *Attorney, Agent, or Firm* — Bayes PLLC

(57) ABSTRACT

Embodiments of semiconductor structures for wafer flatness control and methods for using and forming the same are disclosed. In an example, a model indicative of a flatness difference of a wafer between a first direction and a second direction is obtained. The flatness difference is associated with one of a plurality of fabrication stages of a plurality of semiconductor devices on a front side of the wafer. A compensation pattern is determined for reducing the flatness difference based on the model. At the one of the plurality of the fabrication stages, a compensation structure is formed on a backside opposite to the front side of the wafer based on the compensation pattern to reduce the flatness difference.

21 Claims, 12 Drawing Sheets

(51) Int. Cl.
*H01L 21/302* (2006.01)
*H01L 21/66* (2006.01)
*H01L 23/00* (2006.01)

(52) U.S. Cl.
CPC .. *H01L 21/02274* (2013.01); *H01L 21/02612* (2013.01); *H01L 21/302* (2013.01); *H01L 22/20* (2013.01); *H01L 24/94* (2013.01)

(56) References Cited

U.S. PATENT DOCUMENTS

| | | | |
|---|---|---|---|
| 2014/0369123 A1* | 12/2014 | Costa | G11C 16/0408 365/185.11 |
| 2016/0111361 A1* | 4/2016 | Oh | H01L 27/11548 257/390 |
| 2016/0211223 A1* | 7/2016 | d'Abreu | H01L 23/562 |
| 2017/0148747 A1* | 5/2017 | Chang | H01L 23/562 |
| 2017/0162456 A1* | 6/2017 | Owen | H01L 22/20 |
| 2017/0178891 A1* | 6/2017 | Batinica | H01L 24/94 |
| 2018/0051984 A1* | 2/2018 | Shchegrov | H01L 22/12 |

FOREIGN PATENT DOCUMENTS

| | | |
|---|---|---|
| CN | 103208465 A | 7/2013 |
| CN | 103871837 A | 6/2014 |
| CN | 104425413 A | 3/2015 |
| CN | 105702564 A | 6/2016 |
| CN | 105810557 A | 7/2016 |
| CN | 105977199 A | 9/2016 |
| CN | 107946215 A | 4/2018 |
| TW | 201703188 A | 1/2017 |

OTHER PUBLICATIONS

Written Opinion of the International Searching Authority issued in corresponding International Application No. PCT/CN2018/100800, dated May 20, 2019, 4 pages.

* cited by examiner

US 10,763,099 B2

WAFER FLATNESS CONTROL USING BACKSIDE COMPENSATION STRUCTURE

CROSS REFERENCE TO RELATED APPLICATION

This application is continuation of International Application No. PCT/CN2018/100800, filed on Aug. 16, 2018, entitled "WAFER FLATNESS CONTROL USING BACKSIDE COMPENSATION STRUCTURE," which is hereby incorporated by reference in its entirety.

BACKGROUND

Embodiments of the present disclosure relate to wafer flatness control in semiconductor device fabrication.

Wafer flatness has a very large influence on semiconductor device fabrication because of the impact it can have on the ability of photolithograph systems to effectively project device patterns. Severe changes in surface topography within the area of exposure, however, can alter the device feature patterns and, ultimately, lead to potential die yield loss. For accurate projection, it is thus important to expose a pattern of light on a wafer that is relatively flat or planar. Wafer flatness is also important for other fabrication processes. For example, during the bonding process, the flatness of each wafer to be bonded needs to be controlled within a reasonable deviation range to ensure direct contact of the two bonding surfaces.

SUMMARY

Embodiments of semiconductor structures for wafer flatness control and methods for using and forming the same are disclosed herein.

In one example, a method for controlling wafer flatness is disclosed. A model indicative of a flatness difference of a wafer between a first direction and a second direction is obtained. The flatness difference is associated with one of a plurality of fabrication stages of a plurality of semiconductor devices on a front side of the wafer. A compensation pattern is determined for reducing the flatness difference based on the model. At the one of the plurality of the fabrication stages, a compensation structure is formed on a backside opposite to the front side of the wafer based on the compensation pattern to reduce the flatness difference.

In another example, a method for forming a semiconductor structure is formed. A plurality of semiconductor structures are formed on a front side of a wafer. A film is deposited on a backside opposite to the front side of the wafer. The deposited film on the backside of the wafer is patterned to form a compensation structure partially covering the backside of the wafer, such that a flatness difference of the wafer between a first direction and a second direction is reduced.

In a different example, a semiconductor structure includes a wafer having a front side and a backside opposite to the front side, a plurality of semiconductor devices on the front side of the wafer, and a compensation structure partially covering the backside of the wafer and configured to reduce a flatness difference of the wafer between a first direction and a second direction.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
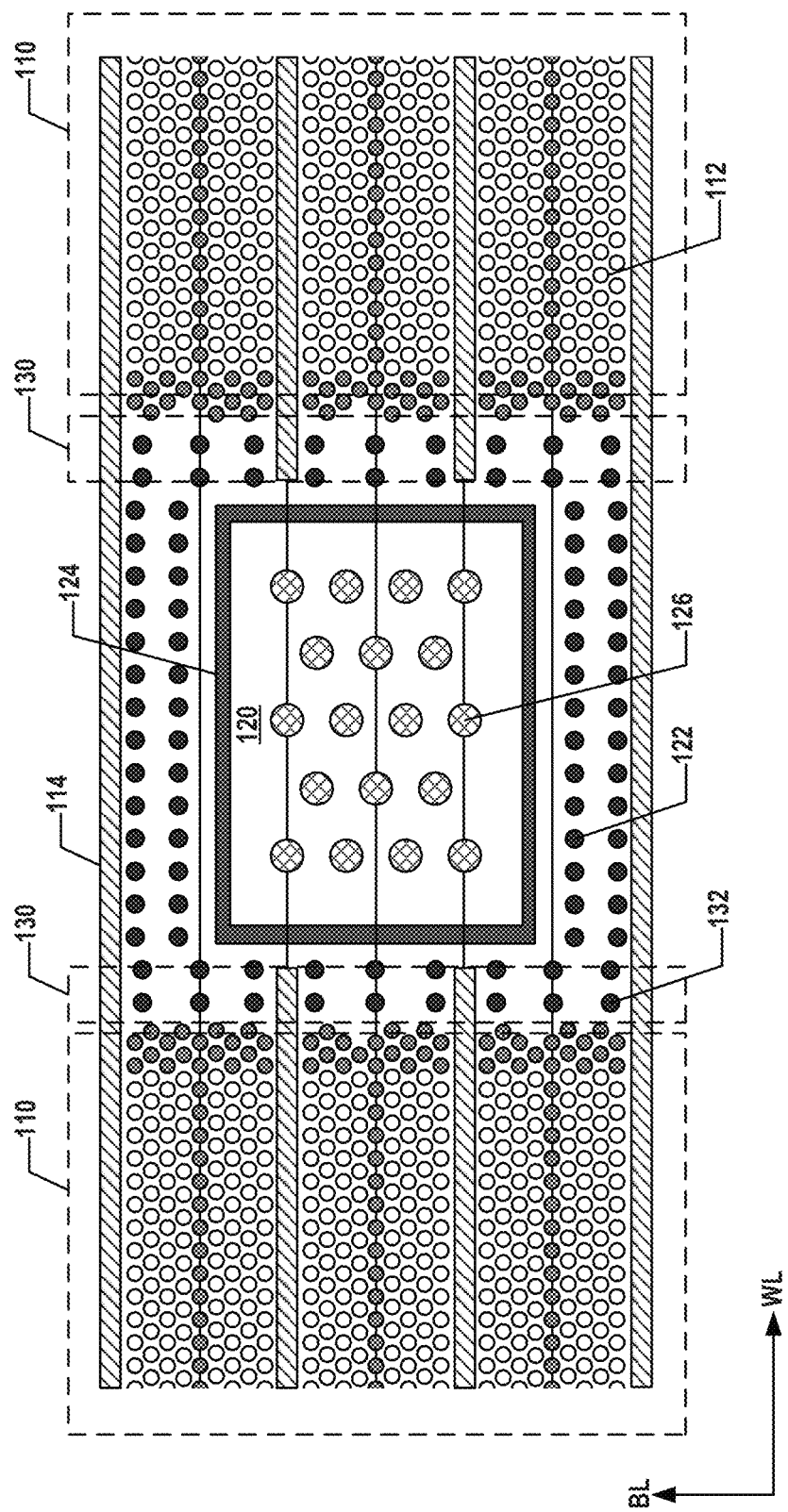
FIGS. 1A-1C illustrate various regions of an exemplary semiconductor device in the plan view, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as glass, plastic, or sapphire.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Backside deposition solution has been used to compensate for the variation of wafer flatness, e.g., wafer bow or wafer warp, caused by mechanical stress built up on the front side of the wafer during semiconductor device fabrication. For example, a bending stress (tension or compression) can be introduced on the front side of the wafer during semiconductor device fabrication. A material film can be uniformly deposited to cover the entire surface of the backside of the wafer in order to restore the curvature of the wafer caused by the bending stress on the opposite side of the wafer. However, certain fabrication stages for making some semiconductor devices (e.g., 3D memory devices) may introduce unbalanced variations of wafer flatness in different directions. In other words, fabrication of some semiconductor structures may cause the curvature of the wafer vary in different directions, which makes the uniform backside deposition solution less effective.

Various embodiments in accordance with the present disclosure provide a novel backside deposition solution using a compensation structure with a specifically-designed pattern for compensating for wafer flatness variations in different directions. The pattern can be determined based on a model indicative of the wafer flatness difference in different directions, which can be generated using simulation data and/or measurement data of wafer flatness at any given fabrication stage. Various properties associated with the compensation structure, such as layout, thickness, and material, can be optimized to balance the wafer flatness difference, thereby improving the yield of the semiconductor devices.

Figure 1B:
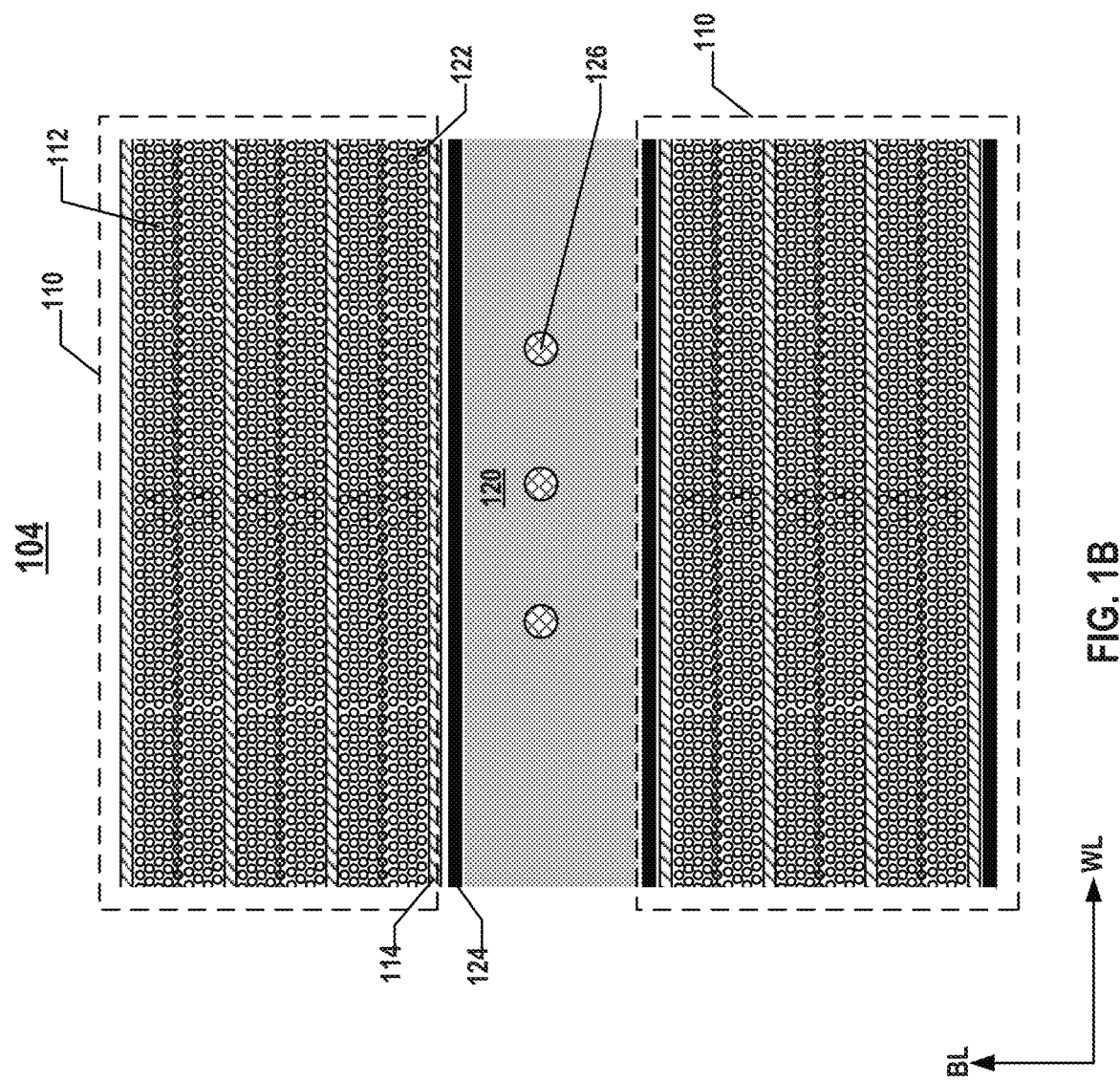
Figure 1C:
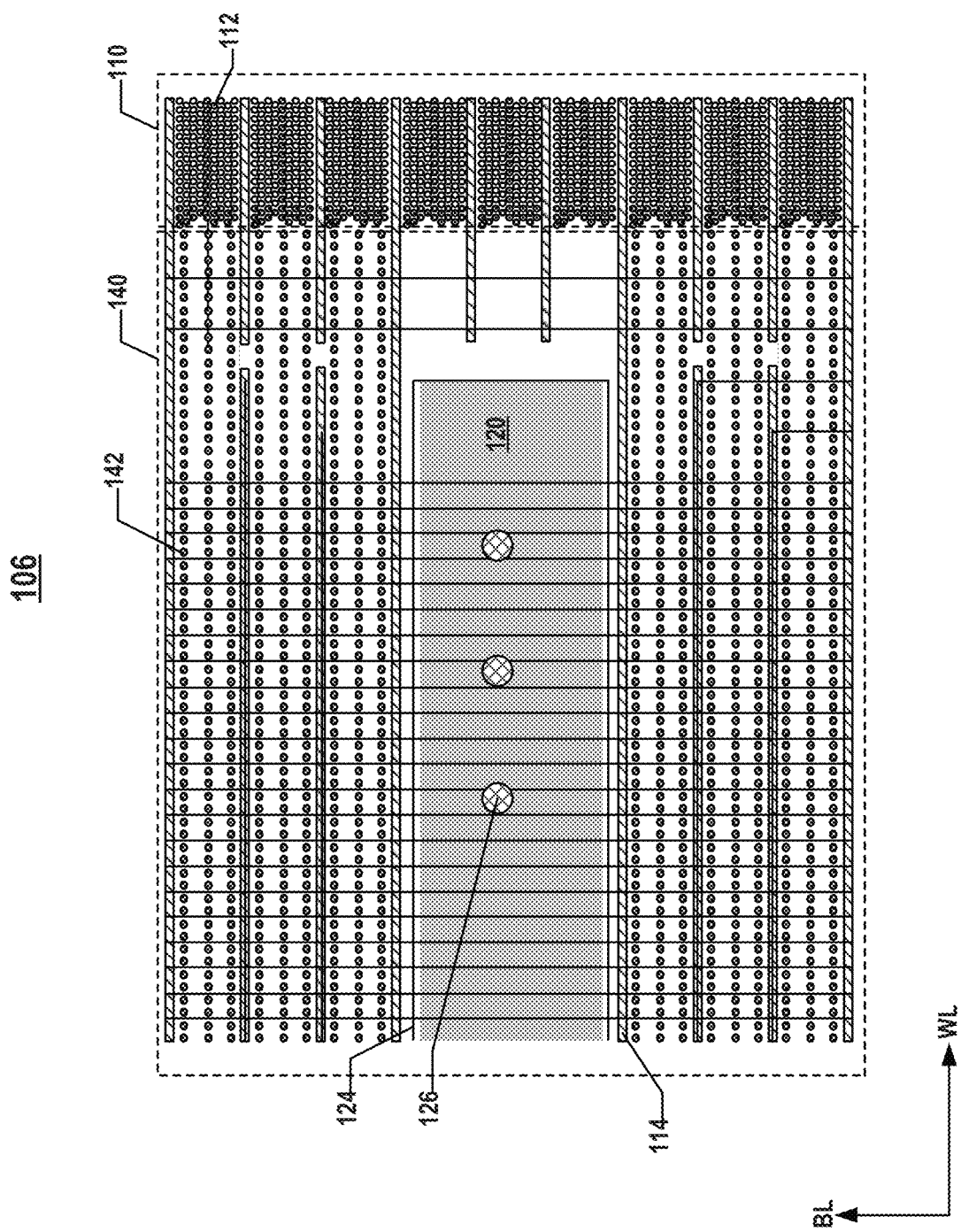

FIGS. 1A-1C illustrate various regions of an exemplary semiconductor device in the plan view, according to some embodiments of the present disclosure. For ease of description, the exemplary semiconductor device will be described as a 3D memory device to illustrate various semiconductor structures formed on the front side of a wafer that can cause the wafer flatness to vary in two directions in the wafer plane. However, it is understood that the semiconductor device is not limited to a 3D memory device and can include any suitable semiconductor devices that can use the backside patterned compensation structure to reduce wafer flatness variation, such as a wafer bow difference, as described below in detail. The semiconductor device can include any suitable logic devices, volatile memory devices (e.g., dynamic random-access memory (DRAM) and static random-access memory (SRAM)), and non-volatile memory devices (e.g., Flash memory) in a 2D, 2.5D, or 3D architecture. As used herein, a "wafer" is a piece of a semiconductor material for semiconductor devices to build in and/or on it and that can undergo various fabrication processes before being separated into dies.

FIG. 1A depicts a word line (WL) through array contact (TAC) region 102 of the 3D memory device, including NAND memory string regions 110, a TAC region 120, and top select gate (TSG) staircase regions 130. NAND memory string regions 110 can include an array of NAND memory strings 112, each including a plurality of stacked memory cells. Each NAND memory string 112 can have a circular shape in the plan view. TSG staircase regions 130 can be disposed on the sides of NAND memory string regions 110 and adjacent to TAC region 120 in the plan view. TSG staircase region 130 can include an array of TSG contacts 132 formed on a staircase structure for making electrical connections with the top select gates of NAND memory strings 112 in NAND memory string region 110.

In some embodiments, TAC region 120 is between two TSG staircase regions 130 in the word line direction of the 3D memory device (labeled as "WL" in FIGS. 1A-1C). TAC region 120 can be defined by a barrier structure 124. Multiple TACs 126 can be formed in TAC region 120, which is enclosed laterally by barrier structure 124. In some embodiments, dummy channel structures 122 are formed outside TAC region 120 to provide mechanical support to the memory array structures. Each dummy channel structure 122 can have a circular shape in the plan view. It is understood that dummy channel structures 122 can be formed in any regions outside TAC region 120, for example, along the edges of NAND memory string regions 110 adjacent to TSG staircase regions 130. As shown in FIG. 1A, WL TAC region 102 can also include a plurality of slit structures 114 each extending laterally in the word line direction and in a strip shape. At least some slit structures 114 can function as the common source contact for an array of NAND memory strings 112 in NAND memory string regions 110. Slit structures 114 can also divide the 3D memory device into multiple memory blocks and/or multiple memory fingers.

FIG. 1B depicts a bit line (BL) TAC region 104 of the 3D memory device, including NAND memory string regions 110 and a TAC region 120. NAND memory string regions 110 can include an array of NAND memory strings 112, each including a plurality of stacked memory cells. In some embodiments, TAC region 120 is between two NAND memory string regions 110 in the bit line direction of the 3D memory device (labeled as "BL" in FIGS. 1A-1C). TAC region 120 can be defined by a barrier structure 124 in conjunction with the edges of BL TAC region 104 of the 3D memory device. Multiple TACs 126 can be formed in TAC region 120, which is enclosed laterally by barrier structure 124 and the edges of BL TAC region 104. As shown in FIG. 1B, BL TAC region 104 can also include slit structures 114 each extending in the word line direction. At least some slit structures 114 can function as the common source contact for an array of NAND memory strings 112 in NAND memory string regions 110. Slit structures 114 can also divide the 3D memory device into multiple memory blocks and/or multiple memory fingers. In some embodiments, dummy channel structures 122 are formed in part of NAND memory string regions 110, for example, in the memory fingers that are adjacent to TAC region 120 in the bit line direction.

FIG. 1C depicts a staircase TAC region 106 of the 3D memory device, including a NAND memory string region 110, a staircase region 140, and a TAC region 120. NAND memory string region 110 can include an array of NAND memory strings 112, each including a plurality of stacked memory cells. Staircase region 140 can include a staircase structure and an array of word line contacts 142 formed on the staircase structure. In some embodiments, TAC region 120 is in staircase region 140. TAC region 120 can be defined by a barrier structure 124 alone or in conjunction with an edge of staircase TAC region 106 of the 3D memory device. Multiple TACs 126 can be formed in TAC region 120, which is enclosed laterally by at least barrier structure 124. As shown in FIG. 1C, staircase TAC region 106 can also include slit structures 114 each extending in the word line direction. At least some slit structures 114 can function as the common source contact for an array of NAND memory strings 112 in NAND memory string region 110. Slit structures 114 can also divide the memory device into multiple memory blocks and/or multiple memory fingers. In some embodiments, dummy channel structures are formed in staircase region 140 outside TAC region 120.

Figure 2:
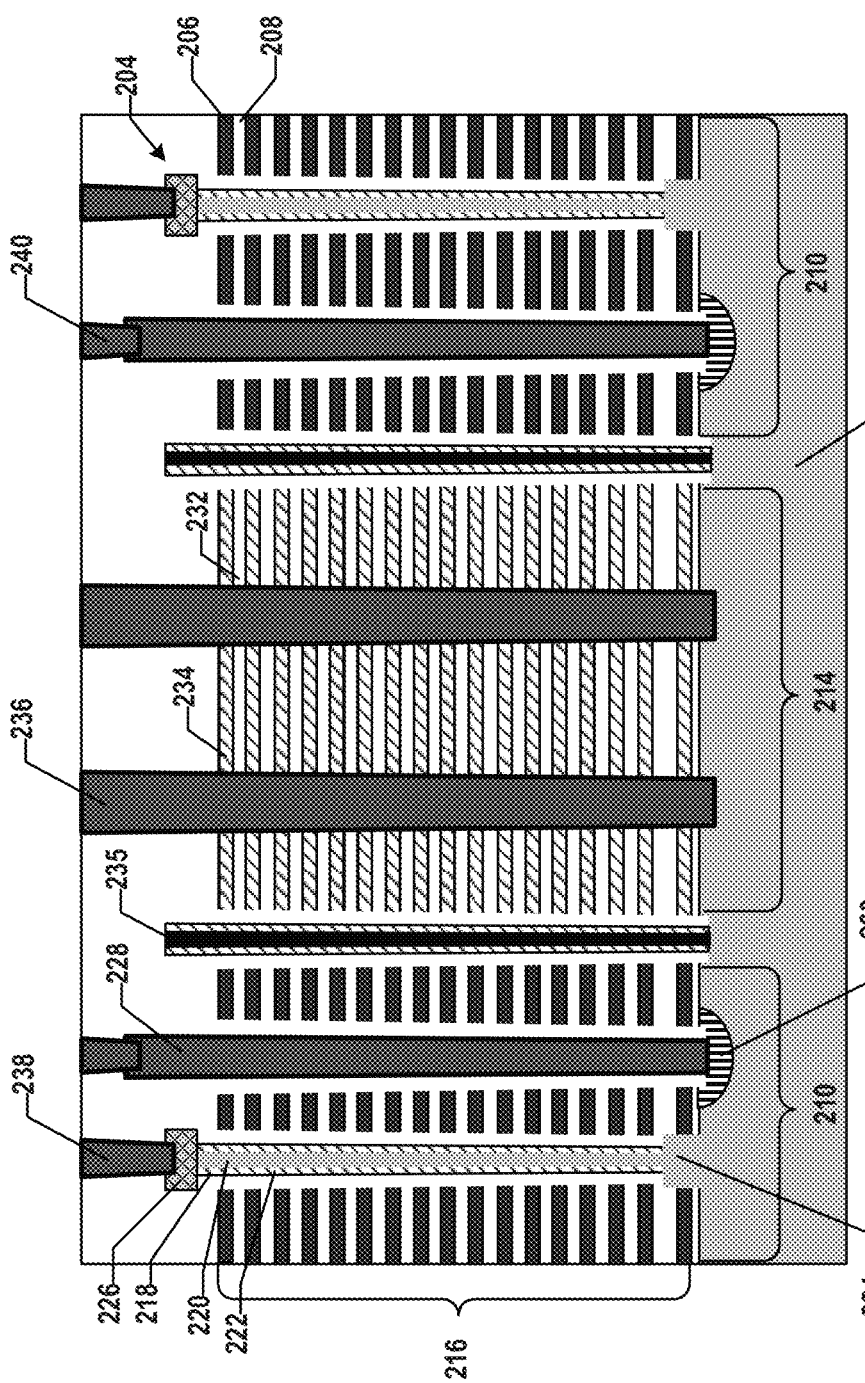
FIG. 2 illustrates a cross-section of an exemplary semiconductor device, according to some embodiments of the present disclosure.

FIG. 2 illustrates a cross-section of a 3D memory device 200, according to some embodiments of the present disclosure. 3D memory device 200 can be formed on the front side of a wafer and include a substrate 202 (e.g. part of the wafer), which can include silicon (e.g., single crystalline silicon), silicon germanium (SiGe), gallium arsenide (GaAs), germanium (Ge), silicon on insulator (SOI), germanium on insulator (GOI), or any other suitable materials.

3D memory device 200 can include memory array devices above substrate 202. It is noted that y and z axes are included in FIG. 2 to further illustrate the spatial relationship of the components in 3D memory device 200. Substrate 202 includes two lateral surfaces extending laterally in the x-y plane: a top surface on the front side of the wafer on which 3D memory device 200 can be formed, and a bottom surface on the backside opposite to the front side of the wafer. The x axis (not shown) is perpendicular to both y and z axes. As used herein, whether one component (e.g., a layer or a device) is "on," "above," or "below" another component (e.g., a layer or a device) of a semiconductor device (e.g., 3D memory device 200) is determined relative to the substrate of the semiconductor device (e.g., substrate 202) in the z-direction (the vertical direction perpendicular to the x-y plane) when the substrate is positioned in the lowest plane of the semiconductor device in the z-direction. The same notion for describing spatial relationship is applied throughout the present disclosure.

In some embodiments, 3D memory device 200 is a NAND Flash memory device in which memory cells are provided in the form of an array of NAND memory strings 204 each extending vertically above substrate 202. Each NAND memory string 204 can extend vertically through a plurality of pairs each including a conductor layer 206 and a dielectric layer 208 (referred to herein as "conductor/dielectric layer pairs"). The stacked conductor/dielectric layer pairs are also referred to herein as a "memory stack" 210. The number of the conductor/dielectric layer pairs in memory stack 210 (e.g., 32, 64, 96, or 128 in one or more tiers) can set the number of memory cells in 3D memory device 200. Conductor layers 206 and dielectric layers 208 in memory stack 210 can stack alternatingly in the vertical direction. At least on one side in the lateral direction, memory stack 210 can include a staircase structure (not shown).

As shown in FIG. 2, each NAND memory string 204 can include a channel structure 218 extending vertically through memory stack 210. Channel structure 218 can include a channel hole filled with semiconductor materials (e.g., as a semiconductor channel 220) and dielectric materials (e.g., as a memory film 222). In some embodiments, semiconductor channel 220 includes silicon, such as amorphous silicon, polysilicon, or single crystalline silicon. In some embodiments, memory film 222 is a composite layer including a tunneling layer, a storage layer (also known as "charge trap/storage layer"), and a blocking layer. Each NAND memory string 204 can have a cylinder shape (e.g., a pillar shape). Semiconductor channel 220, the tunneling layer, the storage layer, and the blocking layer are arranged along a direction from the center toward the outer surface of the pillar in this order, according to some embodiments.

In some embodiments, NAND memory strings 204 include a plurality of control gates (each being part of a word line) for NAND memory strings 204. Conductor layer 206 in memory stack 210 can function as a control gate for memory cells of NAND memory string 204. Conductor layer 206 can include multiple control gates for multiple NAND memory strings 204 and can extend laterally as a word line ending in the staircase structure. In some embodiments, a word line extends in the x-direction (not shown) perpendicular to both the y-direction and the z-direction, which corresponds to the word line direction WL in FIGS. 1A-1C. The bit line direction BL in FIGS. 1A-1C thus corresponds to the y-direction in FIG. 2.

In some embodiments, NAND memory string 204 includes an epitaxial plug 224 and an etch stop plug 226 at a respective end in the vertical direction. Each of epitaxial plug 224 and etch stop plug 226 can be in contact with a respective end of channel structure 218. Epitaxial plug 224 can include a semiconductor material, such as silicon, that is epitaxially grown from substrate 202. Epitaxial plug 224 can function as the channel controlled by a source select gate of NAND memory string 204. Etch stop plug 226 can be at the upper end of NAND memory string 204 and in contact with channel structure 218. As used herein, the "upper end" of a component (e.g., NAND memory string 204) is the end farther away from substrate 202 in the z-direction, and the "lower end" of the component (e.g., NAND memory string 204) is the end closer to substrate 202 in the z-direction when substrate 202 is positioned in the lowest plane of 3D memory device 200.

In some embodiments, 3D memory device 200 further includes slit structures 228. Each slit structure 228 can extend vertically through memory stack 210. Slit structure 228 can also extend laterally to separate memory stack 210 into multiple blocks. Slit structure 228 can include a slit (a trench) filled with conductive materials. Slit structure 228 can further include a dielectric layer with any suitable dielectric materials between the filled conductive materials and memory stack 210 to electrically insulate the filled conductive materials from surrounding conductor layers 206 in memory stack 210. As a result, slit structures 228 can separate 3D memory device 200 into multiple memory blocks and/or memory fingers (e.g., similarly shown in FIGS. 1A-1C in the plan view).

In some embodiments, slit structure 228 functions as the source contact for NAND memory strings 204 in the same memory block or the same memory finger that share the same array common source. Slit structure 228 can thus be referred to as a "common source contact" of multiple NAND memory strings 204. In some embodiments, substrate 202 includes a doped region 230, and the lower end of slit structure 228 is in contact with doped region 230 of substrate 202. Slit structure 228 thus can electrically connect to NAND memory strings 204 by doped region 230. In some embodiments, slit structure 228 also extends laterally in the x-direction (not shown) perpendicular to both the y-direction and z-direction, which corresponds to the word line direction WL in FIGS. 1A-1C.

As shown in FIG. 2, memory stack 210 can be a portion of an alternating layer stack 216, which can also include a dielectric stack 214 on substrate 202. Dielectric stack 214 can include a plurality of dielectric layer pairs, for example, an alternating stack of a first dielectric layer 232 and a second dielectric layer 234 that is different from first dielectric layer 232. First dielectric layers 232 in dielectric stack 214 can be the same as dielectric layers 208 in memory stack 210. In some embodiments, the number of dielectric layer pairs in dielectric stack 214 is the same as the number of conductor/dielectric layer pairs in memory stack 210.

In some embodiments, 3D memory device 200 includes a barrier structure 235 extending vertically through alternating layer stack 216. Barrier structure 235 can laterally separate alternating layer stack 216 into memory stack 210 and dielectric stack 214. That is, barrier structure 235 can become the boundary between memory stack 210 and dielectric stack 214. Dielectric stack 214 can be enclosed laterally by at least barrier structure 235. In some embodiments, barrier structure 235 is in a closed shape (e.g., a rectangle, a square, a circle, etc.) in the plan view to completely enclose dielectric stack 214. For example, as shown in FIG. 1A, barrier structure 124 is in a rectangle shape in the plan view to completely enclose the alternating dielectric stack in TAC region 120. In some embodiments, barrier structure 235 is not in a closed shape in the plan view but can enclose dielectric stack 214 in conjunction with one or more edges of alternating layer stack 216. For example, as shown in FIGS. 1B-1C, barrier structure 124 in conjunction with the edge(s) of the 3D memory device encloses the dielectric stack in TAC region 120.

As shown in FIG. 2, 3D memory device 200 further includes TACs 236 each extending vertically through dielectric stack 214. TACs 236 can be formed only inside the area enclosed laterally by at least barrier structure 235, which includes a plurality of dielectric layer pairs. That is, TACs 236 can extend vertically through dielectric layers (e.g., first dielectric layers 232 and second dielectric layers 234), but not through any conductor layers (e.g., conductor layers 206). Each TAC 236 can extend through the entire thickness of dielectric stack 214. In some embodiments, TAC 236 further extends through at least part of substrate 202. TACs 236 can carry electrical signals from and/or to 3D memory device 200, such as part of the power bus, with shorten interconnect routing. In some embodiments, TACs 236 can provide electrical connections between 3D memory device 200 and the peripheral device (e.g., on a CMOS chip; not shown) and/or between back-end-of-line (BEOL) interconnects (not shown) and the peripheral device. TACs 236 can also provide mechanical support to alternating layer stack 216. Each TAC 236 can include a vertical opening through dielectric stack 214 and that is filled with conductive materials.

In some embodiments, 3D memory device 200 includes a plurality of local contacts in contact with the various memory array structures disclosed herein, such as NAND memory strings 204 and slit structures 228. The contacts are referred to herein as "local contacts" as they are in contact with the memory array structures directly. As shown in FIG. 2, local contacts can include NAND memory string contacts 238 and slit structure contacts 240. TACs 236 can also be considered as local contacts in the present disclosure. As used herein, the term "contact" can broadly include any suitable types of interconnects, including vertical interconnect accesses (e.g., vias) and lateral lines (e.g., interconnect lines). Each local contact can include an opening (e.g., a via hole or a trench) filled with conductive materials.

A variety of semiconductor structures of a 3D memory device are described above with reference to FIGS. 1A-1C and FIG. 2, including NAND memory strings 112 and 204, dummy channel structures 122, slit structures 114 and 228, TACs 126 and 236, and barrier structures 124 and 235, local contacts 132, 142, 238, and 240, and memory stack 210. Different semiconductor structures can have different designs, such as layouts, thicknesses, and materials. In one example, NAND memory strings 112 and 204 and dummy channel structures 122 are arranged in a lattice layout, and each has a circular shape in the plan view and extends vertically through the memory stack. In another example, slit structures 114 and 228 are arranged in a parallel strips layout, and each extends laterally in the x-direction (e.g., the word line direction) and vertically in the z-direction through the memory stack. In still another example, memory stack 210 can be a stack of plates extending in both the z-direction and the x-y plane. The non-uniform nature of the properties (e.g., layout, thickness, and material) associated with different types of semiconductor structures can introduce different levels of mechanical stress in different directions in the wafer plane during the fabrication of the 3D memory device, thereby causing the difference of wafer flatness in different directions.

Moreover, the wafer carrying the semiconductor structures of the 3D memory device undergoes a series of fabrication processes to make the 3D memory device. At different fabrication stages, the properties (e.g., layout, thickness, and material) associated with each type of semiconductor structures may vary as well. Thus, the level and/or direction of the mechanical stress introduced by the same type of semiconductor structures can still vary at different fabrication stages. In one example, the mechanical stress caused by slit structures 228 can change before and after depositing the filling materials into the trenches. In another example, the mechanical stress caused by memory stack 210 can change before, during, and after the gate replacement process, which removes dielectric layers 234 and fills the resulting recesses with conductor layers 206. As a result, the specific fabrication stages need to be taken into consideration for precise control of wafer flatness, according to some embodiments.

Figure 3:
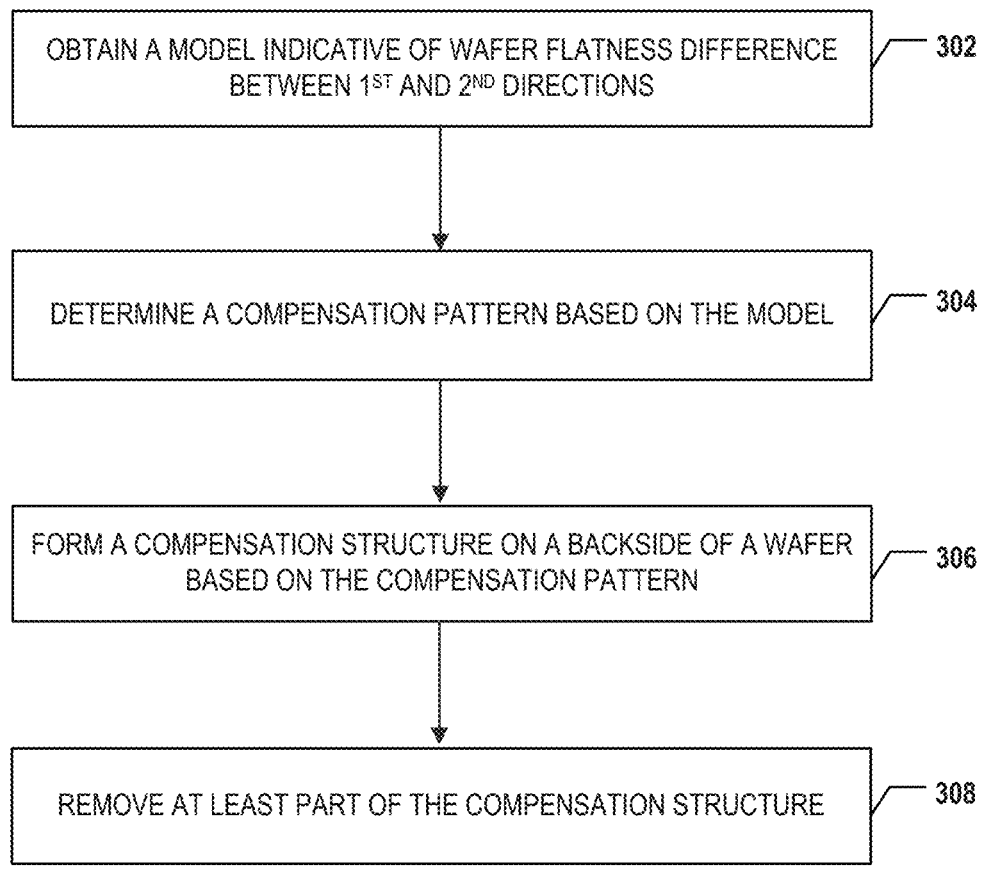
FIG. 3 is a flowchart of a method for controlling wafer flatness, according to some embodiments of the present disclosure.

FIG. 3 is a flowchart of an exemplary method 300 for controlling wafer flatness, according to some embodiments of the present disclosure. It is understood that the operations shown in method 300 are not exhaustive and that other operations can be performed as well before, after, or between any of the illustrated operations. Further, some of the operations may be performed simultaneously, or in a different order than shown in FIG. 3.

Referring to FIG. 3, method 300 starts at operation 302, in which a model indicative of a flatness difference of a wafer between a first direction and a second direction is obtained. The flatness difference can be associated with one of a plurality of fabrication stages of a plurality of semiconductor devices on a front side of the wafer. The wafer can include substrate 202 in FIG. 2 on which 3D memory device 200 is formed (on the front side). The fabrication stages can include, but not limited to, deposition of dielectric stack (e.g., 214 in FIG. 2), etching of channel holes of NAND memory strings (e.g., 204 in FIG. 2), etching of trenches of barrier structures (e.g., 235 in FIG. 2), etching of trenches of slit structures (e.g., 228 in FIG. 2), deposition of filling materials of NAND memory strings (e.g., 204 in FIG. 2), deposition of filling materials of barrier structures (e.g., 235 in FIG. 2), gate replacement for memory stack (e.g., 210 in FIG. 2), deposition of filling materials of slit structures (e.g., 228 in FIG. 2), etching of local contact holes (e.g., TACs 236 in FIG. 2), and deposition of filling materials of local contacts (e.g., TACs 236 in FIG. 2).

The flatness difference of a wafer can include a difference of wafer bow and a difference of wafer warp in two different directions, e.g., a first direction and a second direction. "Wafer bow" is the deviation of the center point of the median surface of a free, un-clamped wafer from the median surface to the reference plane, which is defined by three corners of an equilateral triangle, according to the ASTM F534 standard. "Wafer warp" is the difference between the maximum and the minimum distances of the median surface of a free, un-clamped wafer from the reference plane according to the ASTM F657 and ASTM F1390 standards. The first direction can be perpendicular to the second direction. In some embodiments, the first and second directions are the word line direction and bit line direction, respectively in FIG. 1, or can be the x-direction and y-direction, respectively, as described above with reference to FIG. 2.

In some embodiments, to obtain the model, an initial model indicative of the flatness difference is obtained based on a design of the semiconductor devices and the fabrication stages of the semiconductor devices, a measurement result of the flatness difference is obtained at the specific fabrication stages, and the initial model is adjusted based on the measurement result to obtain the model. The initial model can include a simulation result of the wafer flatness difference (e.g., wafer bow difference) in the first and second directions. The simulation is performed based on various inputs, including the design of the semiconductor devices to be formed on the wafer and the various fabrication for implementing the design of the semiconductor devices, according to some embodiments. The design of the semiconductor devices can include the type of the semiconductor devices (e.g., logic devices, volatile memory devices, or non-volatile memory devices in 2D, 2.5D, or 3D architecture). The design of the semiconductor devices can further include the design of each type of semiconductor structures of a semiconductor device, such as the layout, thickness, and material. The fabrication stages of the semiconductor devices can be different for different types of semiconductor devices. For a 3D memory device (e.g., described above with reference w FIGS. 1A-1C and FIG. 2), the fabrication stages include, for example, deposition of dielectric stack, etching of channel holes of NAND memory strings, etching of trenches of barrier structures, etching of trenches of slit structures, deposition of filling materials of NAND memory strings, deposition of filling materials of barrier structures, gate replacement for memory stack, deposition of filling materials of slit structures, etching of local contact holes, and deposition of filling materials of local contacts. The initial model can be adjusted based on the measurement result to obtain the model. For example, one or more parameters of the initial model can be updated in one or more iterations based on the measurement results.

Figure 4:
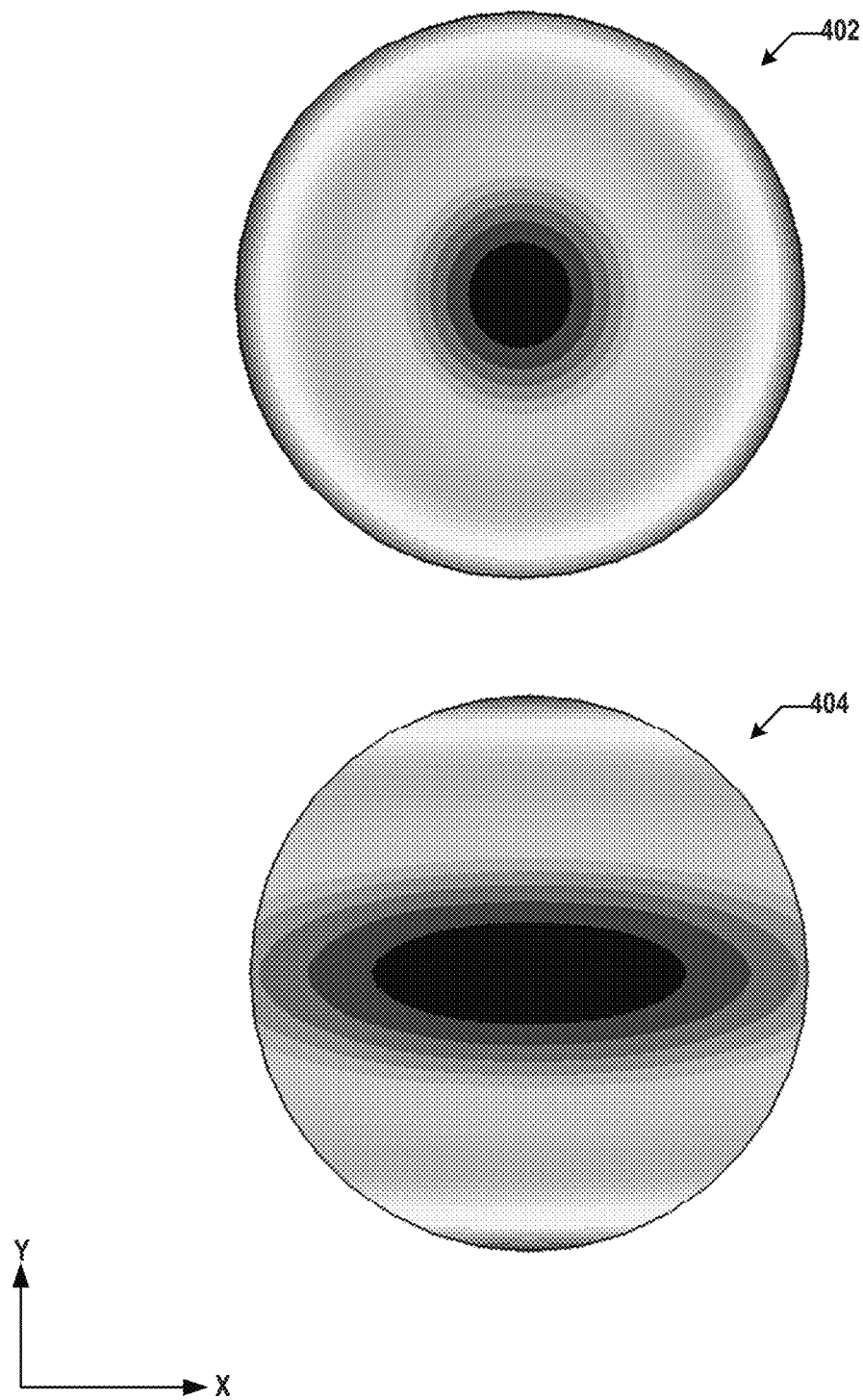
FIG. 4 illustrates exemplary simulation results of wafer bow, according to some embodiments of the present disclosure.

FIG. 4 illustrates exemplary simulation results 402 and 404 of wafer bow, according to some embodiments of the present disclosure. It is noted that x and y axes are included in FIG. 4 to illustrate two orthogonal directions in the wafer plane. As described above, the x-direction is the word line direction, and the y-direction is the bit line direction, according to some embodiments. The level of grayscale of simulation results 402 and 404 indicates the level of wafer displacement away from the reference plane in the z-direction. For example, simulation result 402 is obtained prior to the fabrication stage of etching slit structures (e.g., 114 in FIGS. 1A-1C and 228 in FIG. 2). Simulation result 402 shows relatively uniform wafer bows in all directions in the wafer plane, including the x-direction and y-direction. That is, the wafer bow in the x-direction is substantially the same as the wafer bow in the y-direction in simulation result 402. Simulation result 404 is obtained after the fabrication stage of etching slit structures (e.g., 114 in FIGS. 1A-1C and 228 in FIG. 2). Etching of slit structures can result in a large number of nominally parallel trenches in the x-direction, which can cause a substantial change of wafer bow in the x-direction, but not in the y-direction. Simulation result 404 shows non-uniform wafer bows in the x-direction and y-direction. That is, the wafer bow in the x-direction is different from the wafer bow in the y-direction in simulation result 404. In some embodiments, the simulation results can be used for obtaining the initial model of wafer flatness difference (e.g., wafer bow difference) between the first direction and the second direction (the x-direction and y-direction).

Figure 5:
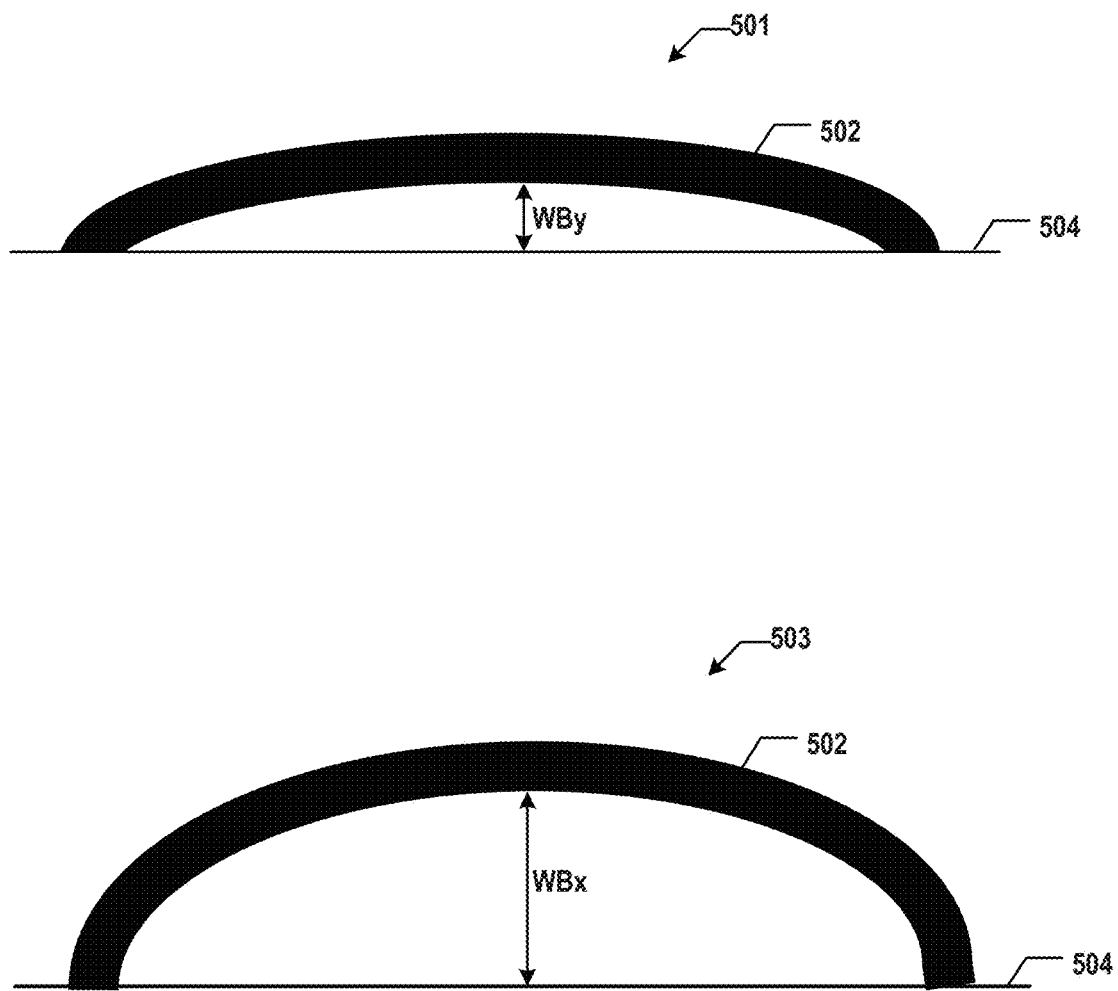
FIG. 5 illustrates exemplary measurement results of wafer bow, according to some embodiments of the present disclosure.

FIG. 5 illustrates exemplary measurement results 501 and 503 of wafer bow, according to some embodiments of the present disclosure. For example, measurement result 501 indicates wafer bow WBy in the y-direction after the fabrication stage of etching slit structures (e.g., 114 in FIGS. 1A-1C and 228 in FIG. 2), and measurement result 503 indicates wafer bow WBx in the x-direction after the fabrication stage of etching the slit structures. Wafer bow WBy and wafer bow WBx can be real data measured from one or more testing wafers. Each of wafer bow WBy and wafer bow WBx can be measured as the deviation of the center point of the median surface of a free, un-clamped wafer 502 from the median surface to a reference plane 504, which is defined by three corners of an equilateral triangle according to the ASTM F534 standard. As shown in measurement results 501 and 503, wafer bow WBx in the x-direction is greater than wafer bow WBy in the y-direction. In some embodiments, the wafer bow difference is calculated by the equation of (WBx−WBy) or the equation of (WBx−WBy)/WBx.

Method 300 proceeds to operation 304, as illustrated in FIG. 3, in which a compensation pattern for reducing the flatness difference is determined based on the model. Various properties associated with the compensation pattern have certain effect on compensating for the wafer flatness difference. In some embodiments, the compensation pattern is associated with at least one of the layout, thickness, and material of the compensation structure. The layout, thickness, material, and/or any other suitable properties associated with the compensation pattern can be analyzed based on the model to reduce the wafer flatness difference at a specific fabrication stage. For example, the layout, thickness, and/or material of the compensation structure can be determined based on the semiconductor structures formed on the front side of the wafer.

In some embodiments, the thicker the compensation pattern is, the higher mechanical stress (i.e., the better compensation effect) the compensation pattern can cause. On the other hand, the compensation pattern can be more likely peeled off when the thickness increases. In some embodiments, mechanical properties of the material associated with the compensation pattern, such as the Young's modulus, also relate to the level of mechanical stress that the compensation patter can cause. In addition to mechanical properties, thermal properties of material associated with the compensation pattern, such as the melting point, can also affect the selection of the material. In some embodiments, the material associated with the compensation pattern is determined based on the specific fabrication stage as well. For example, materials with relatively low melting points cannot be used at fabrication stages using high temperature thermal process.

Method 300 proceeds to operation 306, as illustrated in FIG. 3, in which at the specific fabrication stages, a compensation structure is formed on the backside opposite to the front side of the wafer based on the compensation pattern to reduce the flatness difference. Different from the known backside deposition solution that uniformly covers the entire surface on the backside of the wafer with a material film, the compensation structure formed herein can implement the compensation pattern to reduce the wafer flatness difference caused by unevenly distributed stress on the front side of the wafer. That is, the compensation structure partially covers the backside surface with a specifically-designed pattern that is determined based on the wafer flatness difference, according to some embodiments. The various properties of the compensation structure (e.g., layout, thickness, and material) can be set when determining the compensation pattern.

Figure 6:
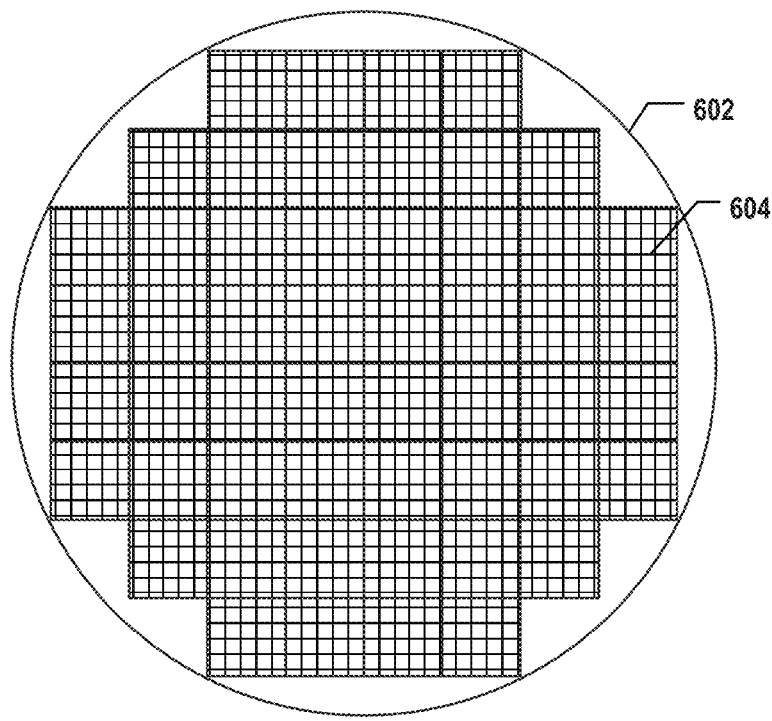
FIG. 6 illustrates the front side of an exemplary wafer having semiconductor devices, according to some embodiments of the present disclosure.
Figure 7A:
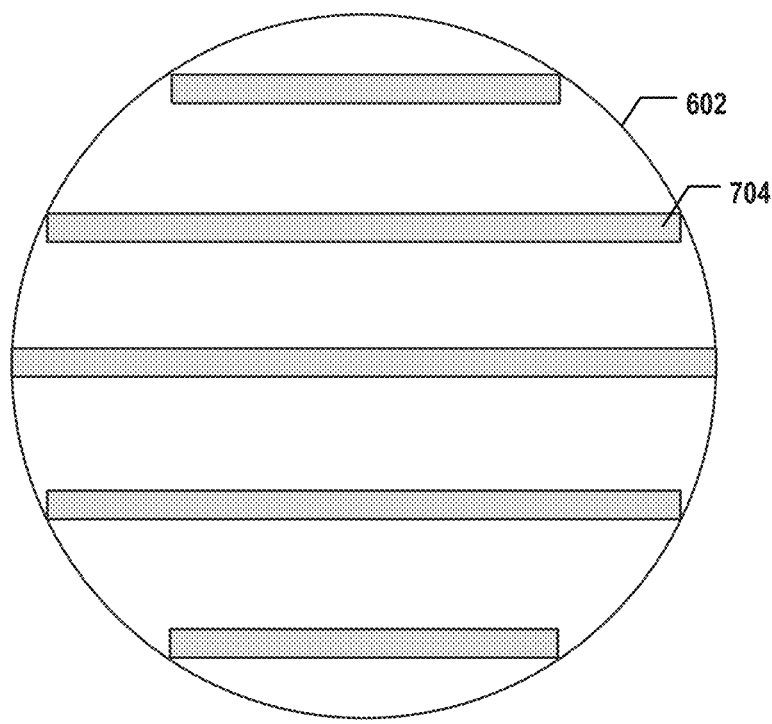
FIG. 7A illustrates the backside of an exemplary wafer having a compensation structure, according to some embodiments of the present disclosure.
Figure 7B:
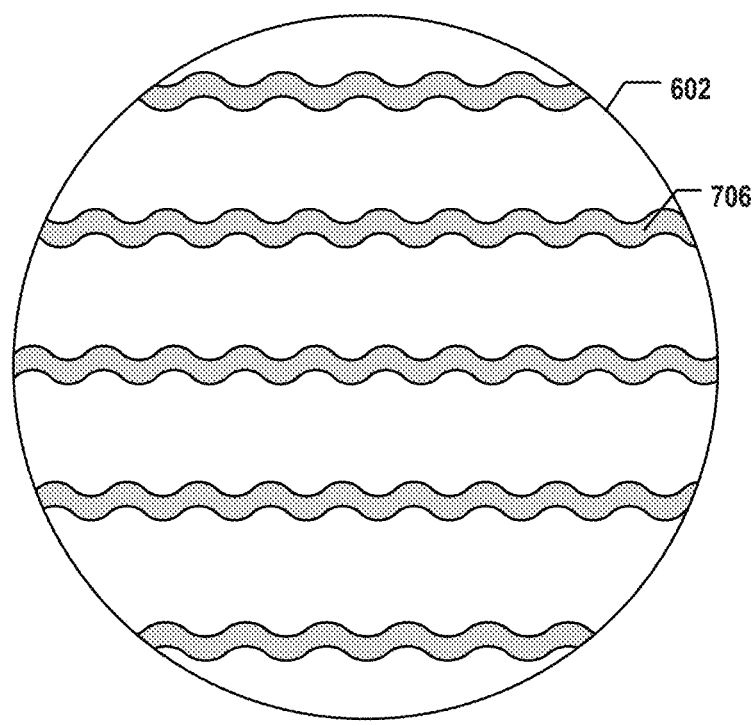
FIG. 7B illustrates the backside of an exemplary wafer having another compensation structure, according to some embodiments of the present disclosure.
Figure 7C:
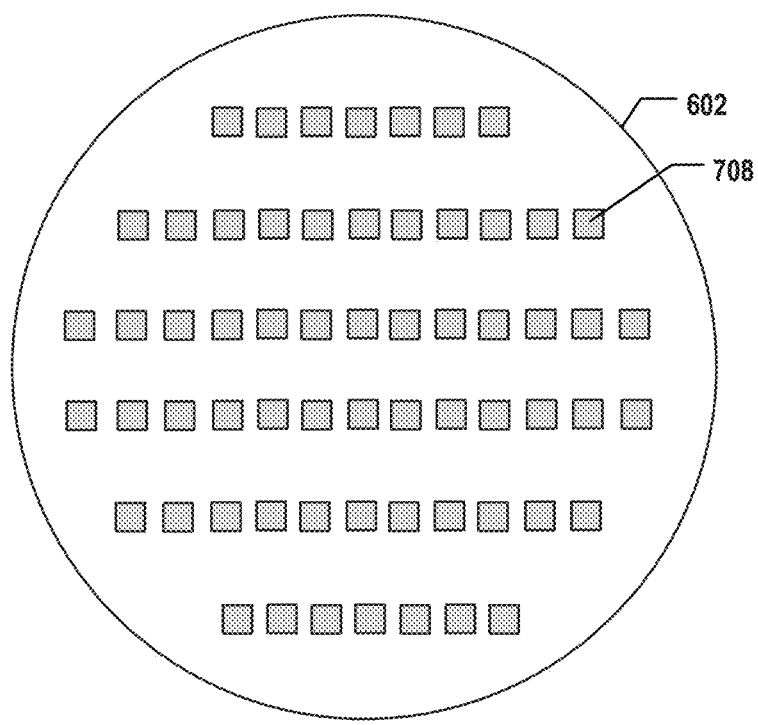
FIG. 7C illustrates the backside of an exemplary wafer having still another compensation structure, according to some embodiments of the present disclosure.
Figure 7D:
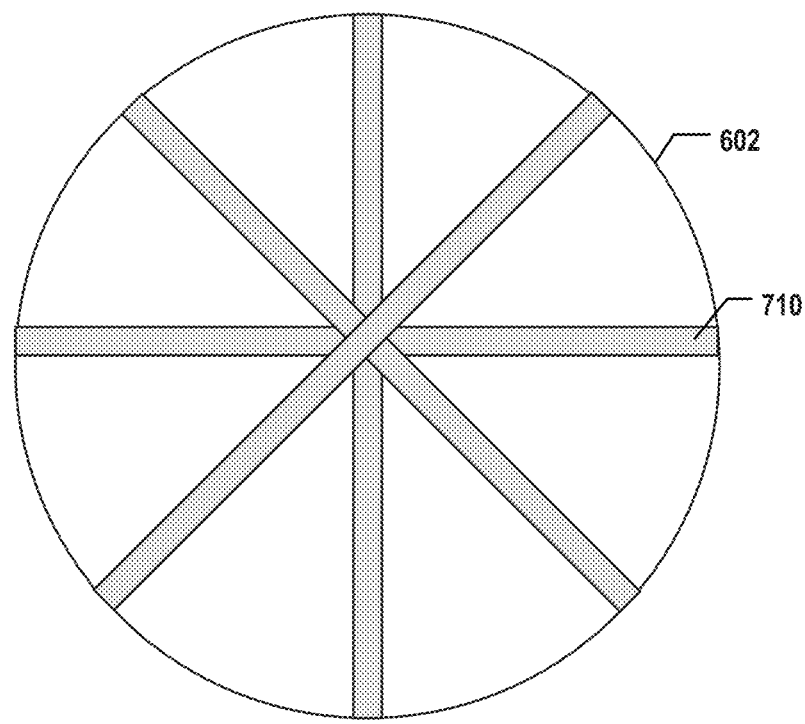
FIG. 7D illustrates the backside of an exemplary wafer having yet another compensation structure, according to some embodiments of the present disclosure.

FIG. 6 illustrates the front side of an exemplary wafer 602 having semiconductor devices, according to some embodiments of the present disclosure. A plurality of dies 604 can be arranged on the front side of wafer 602, and one or more semiconductor devices (e.g., a 3D memory device) can be formed on each die 604. FIGS. 7A-7D illustrate the backside of exemplary wafer 602 having compensation structures 704, 706, 708, and 710, respectively, according to various embodiments. Each compensation structure 704, 706, 708, or 710 partially covers the backside of wafer 602 and is configured to reduce the flatness difference of wafer 602 between a first direction and a second direction caused by the semiconductor devices formed on the front side of wafer 602 at a given fabrication stage, according to some embodiments. Compensation structures 704, 706, 708, and 710 can have different layouts determined based on the wafer flatness model. In one example as shown in FIG. 7A, compensation structure 704 has a parallel straight lines layout. Each of the parallel straight lines (strips) can extend across part or the entirety of wafer 602. In some embodiments, each of the 3D memory devices formed on the front side of wafer 602 includes a plurality of slit structures nominally parallel to one another, each of which extends in the word line direction. The direction in which the parallel straight lines of compensation structure 704 extend thus can be the word line direction as well. In another example as shown in FIG. 7B, compensation structure 706 has a parallel wave lines layout. Each of the parallel wave lines can extend in the word line direction. In still another example as shown in FIG. 7C, compensation structure 708 has a lattice layout. Each point of the lattice can be in any suitable shape including, but not limited to, circular, square, triangle, diamond, etc. In yet another example as shown in FIG. 7D, compensation structure 710 has a radial strips layout. Each of the parallel strips can extend radially from the center point of wafer 602. It is understood that the layouts of the compensation structure are not limited to the examples illustrated in FIGS. 7A-7D, but can be any suitable layouts that can impose unbalanced mechanical stress in different directions on the backside of wafer 602.

As described above, the thickness of the compensation structure can be in a range that can provide sufficient mechanical stress for compensation of the wafer flatness difference and also has sufficient adhesion to the wafer. In some embodiments, the thickness of the compensation structure is not greater than about 5 µm, such as not greater than 5 µm. In some embodiments, the thickness of the compensation structure is between about 100 nm and about 5 µm, such as between 100 nm and 5 µm (e.g., 100 nm, 200 nm, 300 nm, 400 nm, 500 nm, 600 nm, 700 nm, 800 nm, 900 nm, 1 µm, 2 µm, 3 µm, 4 µm, 5 µm, any range bounded by the lower end by any of these values, or in any range defined by any two of these values). In some embodiments, the thickness of the compensation structure is between about 10 nm and about 100 nm, such as between 10 nm and 100 nm (e.g., 10 nm, 20 nm, 30 nm, 40 nm, 50 nm, 60 nm, 70 nm, 80 nm, 90 nm, 100 nm, any range bounded by the lower end by any of these values, or in any range defined by any two of these values).

As described above, the materials of the compensation structure can be selected based on their mechanical properties, such as the Young's modulus, and thermal properties, such as the melting point. In some embodiments, the materials of the compensation structure include dielectric materials, such as silicon nitride, silicon oxide, and silicon oxynitride, and semiconductor materials, such as polysilicon and amorphous silicon. In some embodiments, the materials of the compensation structure include organic materials. The organic materials, however, may not be used for making the compensation structure at certain fabrication stages that involve high temperature thermal processes.

Figure 8A:
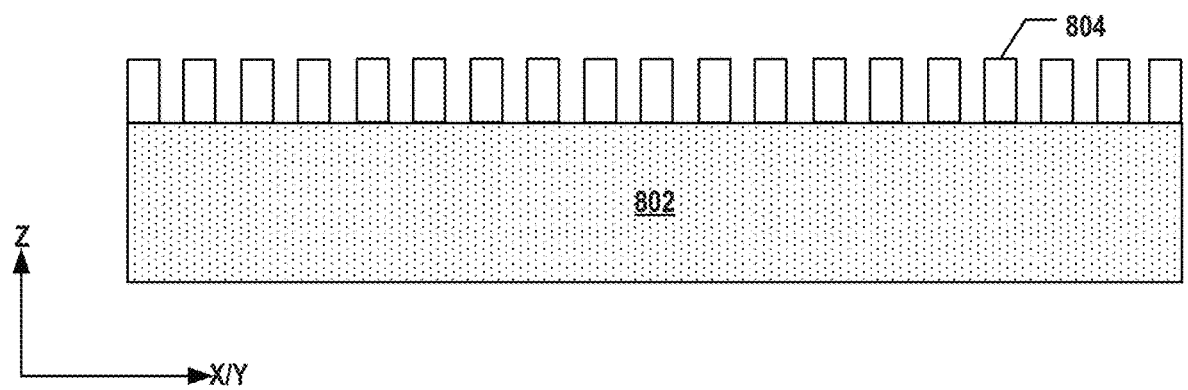
FIGS. 8A-8C illustrate an exemplary fabrication process for forming a semiconductor structure including a compensation structure on the backside of a wafer, according to some embodiments of the present disclosure.
Figure 8B:
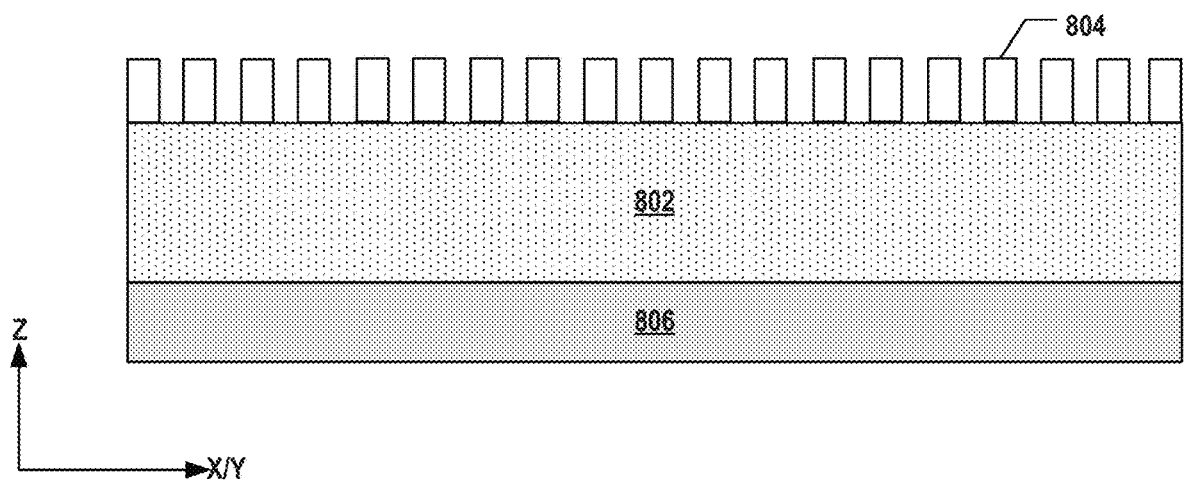
Figure 8C:
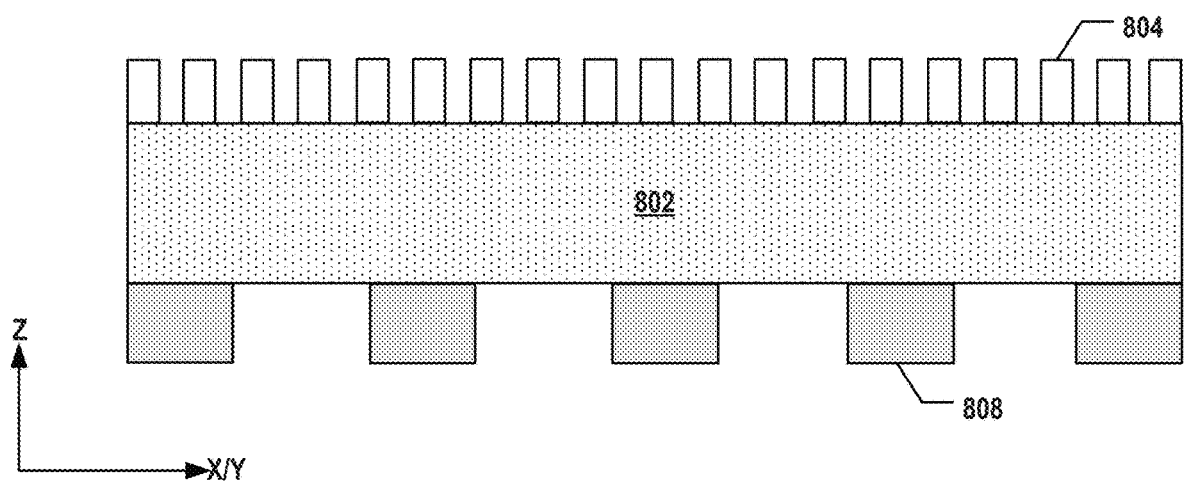
Figure 9:
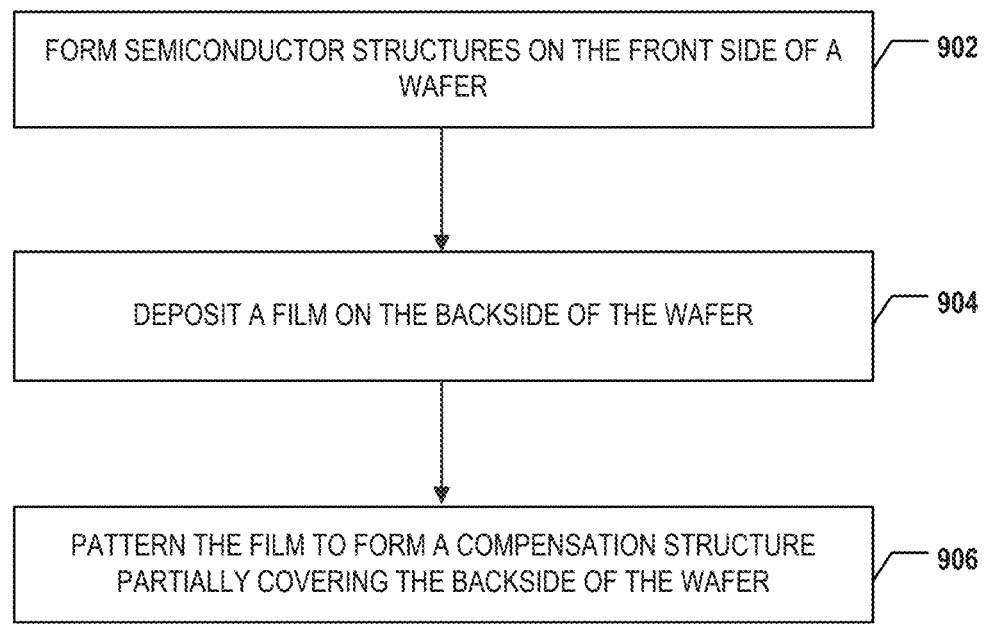
FIG. 9 is a flowchart of a method for forming an exemplary semiconductor structure including a compensation structure on the backside of a wafer, according to some embodiments of the present disclosure.

FIGS. 8A-8C illustrate an exemplary fabrication process for forming a semiconductor structure including a compensation structure 808 on the backside of a wafer 802, according to some embodiments of the present disclosure. FIG. 9 is a flowchart of a method 900 for forming an exemplary semiconductor structure including a compensation structure on the backside of a wafer, according to some embodiments of the present disclosure. FIGS. 8-9 will be described together. It is understood that the operations shown in method 900 are not exhaustive and that other operations can be performed as well before, after, or between any of the illustrated operations. Further, some of the operations may be performed simultaneously, or in a different order than shown in FIGS. 8-9.

Referring to FIG. 9, method 900 starts at operation 902, in which a plurality of semiconductor structures are formed on a front side of a wafer. As illustrated in FIG. 8A, semiconductor structures 804 are formed on the front side of a wafer 802. Semiconductor structures 804 can be parts of any suitable semiconductor devices arranged in multiple dies of wafer 802. Examples of semiconductor structures 804 include various semiconductor structures in the 3D memory devices disclosed herein. The formation of semiconductor structures 804 on the front side of wafer 802 can introduce unbalanced mechanical stress distribution in different directions in the wafer plane, which can cause flatness difference in two different directions of wafer 802.

Method 900 proceeds to operation 904, as illustrated in FIG. 9, in which a film is formed on a backside opposite to the front side of the wafer. As illustrated in FIG. 8B, a film 806 is deposited on the backside of wafer 802. The material of film 806 can include, but not limited to, silicon oxide, silicon nitride, polysilicon, organic materials, or any combination thereof. Film 806 can be formed by one or more thin film deposition processes including, but not limited to, chemical vapor deposition (CVD), physical vapor deposition (PVD), atomic layer deposition (ALD), electrochemical depositions, or any combination thereof. In some embodiments, film 806 is a composite film having multiple sub-films having the same or different materials stacked one above another. The thickness of film 806 is not greater than 5 µm, according to some embodiments.

Method 900 proceeds to operation 906, as illustrated in FIG. 9, in which the deposited film on the backside of the wafer is patterned to form a compensation structure partially covering the backside of the wafer, such that a flatness difference of the wafer between a first direction and a second direction is reduced. The layout, thickness, and/or material of the compensation structure are determined based on the semiconductor structures on the front side of the wafer, which cause the directional unevenness of mechanical stress on the front side of the wafer. In some embodiments, the stress of the compensation structure is also uneven in the first direction and in the second direction to compensate for the unevenness of stress in the first and second directions on the front side of the wafer.

As illustrated in FIG. 8C, film 806 is patterned to form a compensation structure 808 on the backside of wafer 802, which partially covers the backside of wafer 802. The pattern of compensation structure 808 can be specifically designed to reduce the flatness difference of wafer 802 between a first direction and a second direction. Thus, the stress of compensation structure 808 can be uneven in the first direction and in the second direction as well. In some embodiments, the layouts of compensation structure 808 in the plan view include, but not limited to, parallel straight lines, parallel wave lines, radial strips, and lattice. To pattern compensation structure 808, a photoresist layer can be first patterned using the specifically designed layout by photolithography and development. The patterned photoresist layer then can be used as an etch mask to etch the exposed portions of film 806 by wet etch and/or dry etch. Any suitable etchants (e.g., of wet etch and/or dry etch) can be used to remove a certain thickness of film 806 in the exposed portions. The etched thickness can be controlled by etch rate and/or etch time. Some properties of compensation structure 808 can be the same as those of film 806, such as the material and the thickness described above in detail.

Referring back to FIG. 3, method 300 further includes operation 308, in which at least part of the compensation structure is removed from the backside of the wafer. In some embodiments, part or the entirety of the compensation structure is removed either by the subsequent fabrication processes, e.g., wafer thinning or dicing, or to allow the subsequent fabrication processes to be performed (e.g., fabrication processes that require backside vacuum suction to hold the wafer). The timing of removing the compensation structure can be determined based on the current fabrication process and/or subsequent fabrication processes. In some embodiments, the removal of the compensation structure does not affect the backside stress compensation after certain fabrication stages, for example, when openings of semiconductor structures have been filled with filling materials during the fabrication stage. It is understood that in some embodiments, part or the entirety of the compensation structure remains intact even after the final fabrication process.

According to one aspect of the present disclosure, a method for controlling wafer flatness is disclosed. A model indicative of a flatness difference of a wafer between a first direction and a second direction is obtained. The flatness difference is associated with one of a plurality of fabrication stages of a plurality of semiconductor devices on a front side of the wafer. A compensation pattern is determined for reducing the flatness difference based on the model. At the one of the plurality of the fabrication stages, a compensation structure is formed on a backside opposite to the front side of the wafer based on the compensation pattern to reduce the flatness difference.

In some embodiments, the flatness difference includes a difference of wafer bow.

In some embodiments, the first direction is perpendicular to the second direction.

In some embodiments, the plurality of semiconductor devices include a plurality of 3D memory devices. Each of the 3D memory devices includes a plurality of slit structures nominally parallel to one another, and the first direction is the same as a direction in which the slit structures extend, according to some embodiments. The compensation structure can include a plurality of strips each extending in the first direction.

In some embodiments, to obtain the model, an initial model indicative of the flatness difference is obtained based on a design of the semiconductor devices and the fabrication stages of the semiconductor devices, a measurement result of the flatness difference at the one of the plurality of the fabrication stages is obtained, and the initial model is adjusted based on the measurement result to obtain the model.

In some embodiments, the compensation pattern is associated with at least one of a layout, a thickness, and a material of the compensation structure. The material of the compensation pattern is determined based on the model and the one of the plurality of the fabrication stages, according to some embodiments.

In some embodiments, at least part of the compensation structure is removed from the backside of the wafer.

According to another aspect of the present disclosure, a method for forming a semiconductor structure is formed. A plurality of semiconductor structures are formed on a front side of a wafer. A film is deposited on a backside opposite to the front side of the wafer. The deposited film on the backside of the wafer is patterned to form a compensation structure partially covering the backside of the wafer, such that a flatness difference of the wafer between a first direction and a second direction is reduced.

In some embodiments, a thickness of the compensation structure is not greater than about 5 μm. In some embodiments, a layout of the compensation structure includes at least one of parallel straight lines, parallel wave lines, radial strips, and lattice. In some embodiments, a material of the compensation structure includes at least one of silicon oxide, silicon nitride, polysilicon, and an organic material. In some embodiments, at least one of a layout, a thickness, and a material of the compensation structure is determined based on the plurality of semiconductor structures formed on the front side of the wafer. In some embodiments, a stress of the compensation structure is uneven in the first direction and in the second direction.

In some embodiments, the flatness difference comprises a difference of wafer bow.

In some embodiments, the first direction is perpendicular to the second direction.

In some embodiments, the plurality of semiconductor structures include a plurality of slit structures nominally parallel to one another, and the first direction is the same as a direction in which the slit structures extend. The compensation structure can include a plurality of strips each extending in the first direction.

In some embodiments, at least part of the compensation structure is removed from the backside of the wafer.

According to still another aspect of the present disclosure, a semiconductor structure includes a wafer having a front side and a backside opposite to the front side, a plurality of semiconductor devices on the front side of the wafer, and a compensation structure partially covering the backside of the wafer and configured to reduce a flatness difference of the wafer between a first direction and a second direction.

In some embodiments, a thickness of the compensation structure is not greater than about 5 μm.

In some embodiments, a layout of the compensation structure includes at least one of parallel straight lines, parallel wave lines, radial strips, and lattice. In some embodiments, a material of the compensation structure includes at least one of silicon oxide, silicon nitride, polysilicon, and an organic material. In some embodiments, a stress of the compensation structure is uneven in the first direction and in the second direction.

In some embodiments, the flatness difference comprises a difference of wafer bow.

In some embodiments, the first direction is perpendicular to the second direction.

In some embodiments, the plurality of semiconductor devices include a plurality of 3D memory devices. Each of the 3D memory devices includes a plurality of slit structures nominally parallel to one another, and the first direction is the same as a direction in which the slit structures extend, according to some embodiments. The compensation structure can include a plurality of strips each extending in the first direction.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for controlling wafer flatness, comprising:
   obtaining a model indicative of a flatness difference of a wafer between a first direction and a second direction, the flatness difference being associated with one of a plurality of fabrication stages of a plurality of semiconductor devices on a front side of the wafer;
   determining a compensation pattern for reducing the flatness difference based on the model;
   at the one of the plurality of the fabrication stages, forming a compensation structure on a backside opposite to the front side of the wafer based on the compensation pattern to reduce the flatness difference; and removing at least part of the compensation structure from the backside of the wafer.

2. The method of claim 1, wherein the flatness difference comprises a difference of wafer bow.

3. The method of claim 1, wherein the first direction is perpendicular to the second direction.

4. The method of claim 1, wherein the plurality of semiconductor devices comprise a plurality of three-dimensional (3D) memory devices.

5. The method of claim 4, wherein
each of the 3D memory devices comprises a plurality of slit structures nominally parallel to one another; and
the first direction is the same as a direction in which the slit structures extend.

6. The method of claim 5, wherein the compensation structure comprises a plurality of strips each extending in the first direction.

7. The method of claim 1, wherein obtaining the model comprises:
obtaining an initial model of simulation indicative of the flatness difference based on a design of the semiconductor devices and the fabrication stages of the semiconductor devices;
obtaining a measurement result of the flatness difference at the one of the plurality of the fabrication stages; and
adjusting the initial model based on the measurement result to obtain the model.

8. The method of claim 1, wherein the compensation pattern is associated with at least one of a layout, a thickness, and a material of the compensation structure.

9. The method of claim 8, wherein the material associated with the compensation pattern is determined based on the model and the one of the plurality of the fabrication stages.

10. The method of claim 1, wherein removing at least the part of the compensation structure is performed after filling openings of the plurality of semiconductor devices.

11. The semiconductor structure of claim 1, wherein the at least part of the compensation structure is removed from the backside of the wafer before an end of the respective fabrication process.

12. A method for forming a semiconductor structure, comprising:
forming a plurality of semiconductor structures on a front side of a wafer;
depositing a film on a backside opposite to the front side of the wafer;
patterning the deposited film on the backside of the wafer to form a compensation structure partially covering the backside of the wafer, such that a flatness difference of the wafer between a first direction and a second direction is reduced; and
removing at least part of the compensation structure from the backside of the wafer.

13. The method of claim 12, wherein a thickness of the compensation structure is not greater than about 5 μm.

14. The method of claim 12, wherein a layout of the compensation structure comprises at least one of parallel straight lines, parallel wave lines, radial strips, and lattice.

15. The method of claim 12, wherein a material of the compensation structure comprises at least one of silicon oxide, silicon nitride, polysilicon, and an organic material.

16. The method of claim 12, wherein
the plurality of semiconductor structures comprise a plurality of slit structures nominally parallel to one another; and
the first direction is the same as a direction in which the slit structures extend.

17. A semiconductor structure, comprising:
a wafer having a front side and a backside opposite to the front side;
a plurality of semiconductor devices on the front side of the wafer; and
a compensation structure partially covering the backside of the wafer and configured to reduce a flatness difference of the wafer between a first direction and a second direction,
wherein a layout of the compensation structure comprises at least one of parallel wave lines, radial strips, or lattice.

18. The semiconductor structure of claim 17, wherein a thickness of the compensation structure is not greater than about 5 μm.

19. The semiconductor structure of claim 17, wherein a material of the compensation structure comprises at least one of silicon oxide, silicon nitride, polysilicon, and an organic material.

20. The semiconductor structure of claim 17, wherein the plurality of semiconductor devices comprise a three-dimensional (3D) memory device, the 3D memory device comprising at least one structure extending along the same direction as the compensation structure.

21. The semiconductor structure of claim 17, wherein the plurality of semiconductor devices comprise a 3D memory device, the 3D memory device comprising a through-array contact (TAC) in a dielectric stack which comprises interleaved a plurality of first dielectric layers and a plurality of second dielectric layers surrounded by a barrier structure.

* * * * *